(12) United States Patent
Abrosimov

(10) Patent No.: US 7,292,085 B2
(45) Date of Patent: Nov. 6, 2007

(54) TIMING DELAY GENERATOR AND METHOD USING TEMPERATURE STABILISATION

(76) Inventor: Igor Anatolievich Abrosimov, Moskovskiy prospect, 36-7, St. Petersburg (RU) 190000

( * ) Notice: Subject to any disclaimer, the term of this patent is extended or adjusted under 35 U.S.C. 154(b) by 980 days.

(21) Appl. No.: 10/090,815

(22) Filed: Jul. 11, 2002

(65) Prior Publication Data

US 2006/0119407 A1  Jun. 8, 2006

Related U.S. Application Data

(60) Provisional application No. 60/238,028, filed on Oct. 6, 2000.

(51) Int. Cl.
*H03H 11/26* (2006.01)

(52) U.S. Cl. ...................... 327/262; 327/276

(58) Field of Classification Search ............... 327/262, 327/276, 277, 278, 83, 138, 378, 512
See application file for complete search history.

(56) References Cited

U.S. PATENT DOCUMENTS

| 4,398,115 | A | * | 8/1983 | Gagnepain et al. ..... 310/313 A |
| 4,511,846 | A | | 4/1985 | Nagy et al. |
| 4,837,521 | A | | 6/1989 | Herlein et al. |
| 5,043,596 | A | * | 8/1991 | Masuda et al. ............. 327/297 |
| 6,092,030 | A | | 7/2000 | Lepejian et al. |

* cited by examiner

*Primary Examiner*—Linh My Nguyen
(74) *Attorney, Agent, or Firm*—Harold L. Marquis; George M. Thomas; James W. Kayden

(57) ABSTRACT

A timing delay generator for supplying a signal delayed by a predetermined period comprises a vernier that provides variable delays for a main signal, the delays being sensitive to temperature variation, a sensor for sensing the vernier's temperature and a feedback loop to maintain the temperature of the silicon die at a constant level and thus, to provide the high long-term accuracy of the timing delay generator.

8 Claims, 1 Drawing Sheet

TIMING DELAY GENERATOR AND METHOD USING TEMPERATURE STABILISATION

BACKGROUND OF THE INVENTION

1. Field of the Invention

The present invention is directed generally to the field of testing semiconductor devices and, more particularly, to the generation of clock signals for controlling the testing operation of such devices. The present invention is particularly aimed at the problem of applying electrical signals to and measuring the response from semiconductor devices at precise and accurate time intervals.

2. Background Art

Many high-speed semiconductor devices, such as synchronous dynamic random access memories (SDRAM), microprocessors, etc. rely upon clock signals to control the flow of commands, data, addresses, etc., into, through, and out of the devices. Additionally, new types of circuit architectures such as RAMBUS and DDR SDRAM require individual parts to work in unison even though such parts may individually operate at different speeds.

As a result, the ability to control the operation of a part through the generation of local clock signals has become increasingly more important. Moreover, such delay generators may be used in data path instead of clock path to control timing on per-bit basis that requires even greater accuracy.

A problem arises because it is often desired to delay signals at time intervals shorter than one period of the master oscillator. For example, the master oscillator might have a frequency of 100 MHz. Such an oscillator has a period of 10 nsec. However, in the tester it may be desired to place timing edges with precision of 5 psec and an accuracy of 25 psec.

This is typically implemented by using a delay line to form a timing vernier as is shown in the prior art. The signal passes through the delay line which has taps spaced closely apart in time. By selecting the appropriate taps several signals with intermediate timing can be generated. This procedure has been discussed in some detail in U.S. Pat. No. 4,511,846 and U.S. Pat. No. 4,837,521.

The early prior art is primarily concerned with circuits having constant current flowing through the logic elements and not much sensible to environmental parameters. However, as integrated circuit technology has progressed and demanded higher speed, more accurate and more complicated testing equipment, a problem arises to be applied to the timing vernier circuitry is that logic propagation delays are dependent upon the power supply voltage and the temperature of the silicon substrate.

As for the supply voltage sensitivity, it can be managed by very tightly regulating the supply voltage, though this adds cost to the test system, while the temperature of the substrate is much more difficult to control.

If the power dissipation of a circuit is constant, the substrate temperature can be controlled by placing the circuit in a temperature controlled oven as has been known in the prior art for many years. However, when the power dissipation is a result of capacitive charging and discharging, it is approximately proportional to the square of the operating frequency. This means that if the circuit operating frequency were to suddenly increase, as it will in many common test modes, the power dissipation may easily increase by a factor of 100. This sudden burst of power is very difficult to account for with an oven.

Additionally, the problem of variable environmental parameters can be solved as suggested in U.S. Pat. No. 6,092,030, when the effect of the significant environmental variables is measured and an adjustment made to the delay circuitry to compensate for the changes in the environmental variable is stored in a memory. Circuitry is designed into the integrated circuit that will measure the appropriate environmental variable or variables. The results of the measurement are used to adjust the delay so that the timing edges are in the correct location with respect to the master oscillator.

However, the above technical solution requires continuos monitoring and updating compensation values and also frequent re-calibration of adjustment coefficients to provide accurate timing which is a costly and time consuming operation affecting timing accuracy.

It is therefore an object of the present invention to provide a system and method for supplying accurate and constant time delays which do not depend on such environment parameters as temperature variations and do not require continuous update, but allows for simple and cost-effective maintenance.

BRIEF SUMMARY OF THE INVENTION

According to the present invention, the temperature sensor is incorporated into vernier silicon die to allow measuring the temperature of vernier. The results of the measurement are used by a feedback loop circuitry to maintain the temperature of the vernier constant and thus, to ensure the delays are stable, so that the timing edges are in the correct location with respect to the main signal for a long period of time.

According to one aspect of the invention, a device for supplying a signal delayed by a predetermined period has been proposed, the device comprising:

an input terminal for receiving an input main signal;

an output terminal at which a delayed output signal is generated;

a vernier that provides variable delays for a main signal;

a sensor incorporated into said vernier for sensing for vernier's temperature;

a feedback loop for maintaining the temperature of the vernier at a constant level.

Preferably, the sensor is incorporated into the vernier's silicon die.

Preferably the feedback loop comprises an integrator for providing on his output integrated difference of the temperature sensor output and reference voltage. A heater/cooler is provided for maintaining the temperature of vernier, the heater/cooler being preferably implemented in Peltier effect reversable heat pump.

Preferably, the cooler/heater has a low temperature resistance contact with the vernier's package.

DETAILED DESCRIPTION OF THE INVENTION

Figure 1:
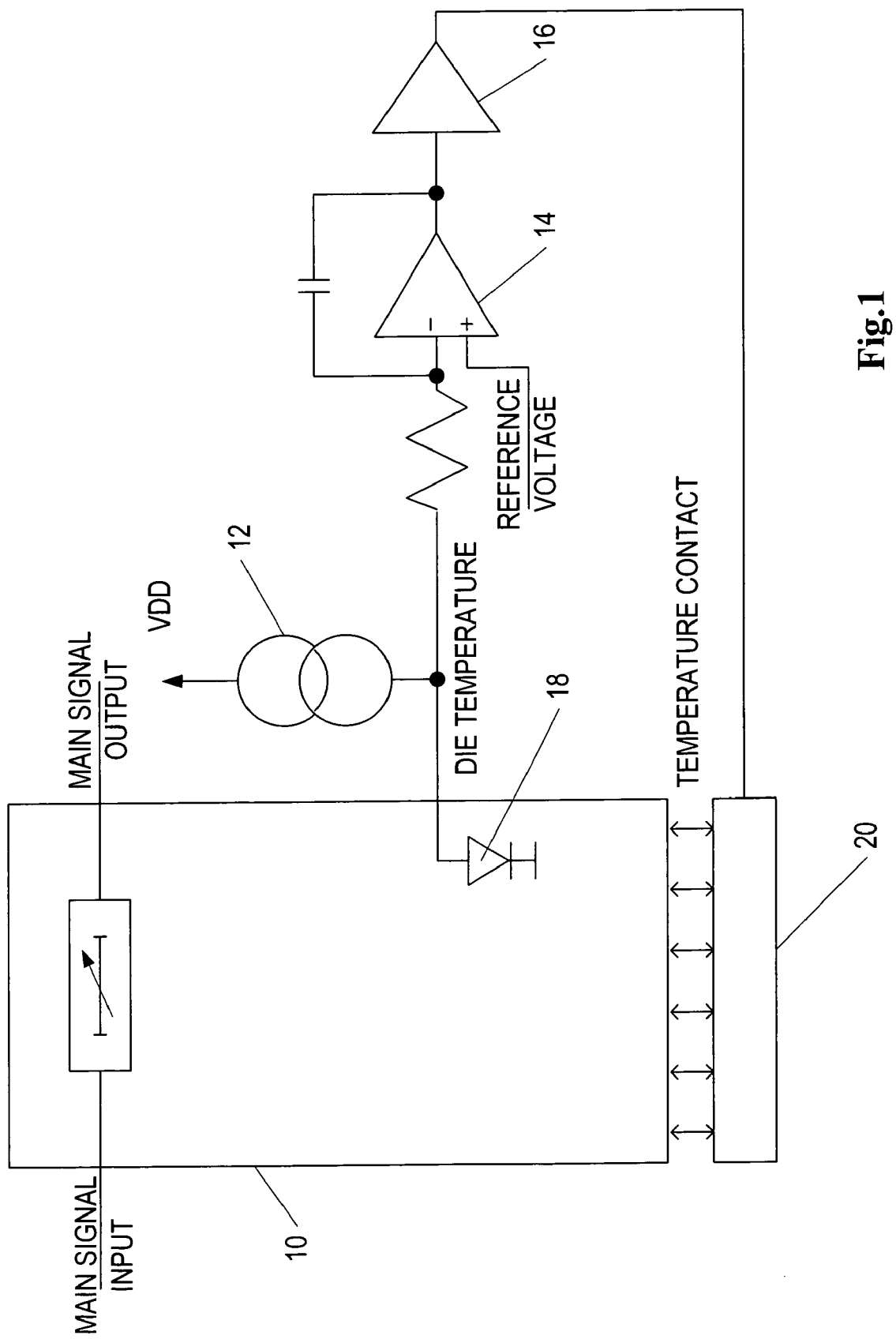
FIG. 1 is a schematic diagram of an illustrative implementation of a timing delay generator with a temperature stabilizer.

A specialist of ordinary skill in the art will realize that the following description of the present invention is illustrative only and not in any way limiting.

In FIG. 1 an example block diagram of a timing delay generator with temperature stabilizer is shown. The delay generator 10 may be implemented in, e.g. Edge 629 vernier manufactured by Edge Semiconductors (US). The delay generator is used to provide the controlled delays in a main signal path. A temperature sensor is incorporated in the silicon die of the vernier to allow the most accurate measuring of the temperature of the vernier structure sensitive to the temperature without additional affects caused by the package of the clip. Such kind of temperature sensors require a constant current 12 for normal operation as shown in FIG. 1. Integrator 14 provides on his output integrated difference of the temperature sensor output and reference voltage. The signal is passed to a cooler/heater 20 through amplifier 16. The cooler/heater may be implemented in, e.g., Peltier effect reversable heat pump. The cooler/heater 20 has a low temperature resistance contact with the vernier's package.

Thus, when the temperature of the die is lower than the determined by the reference voltage, the voltage at the output of integrator 14 falls. This signal may be amplified, if desired, by amplifier 16 and supplied to the heat pump that will cause the increase in die's temperature. To the contrary, when the temperature of the die is too high, the voltage at the output of the integrator 14 rises. This elevated voltage passes through amplifier 16 and heat pump 20 and causes the die temperature to fall.

To reduce the energy consumption of the heat pump, the most efficient way to determine the optimal voltage reference is to measure the voltage at the output of the die temperature sensor when the heater/cooler is switched off.

It shall be also appreciated that according to the present invention, the temperature is maintained as close to the natural level, i.e. to the ambient temperature, as possible so as to reduce extra heating of the temperature stabilizing circuitry.

It shall be evident for a specialist in the art that various modifications can be made within the scope of the present invention, for example, the above technical solution may be applied to the ATE pin driver ASIC to keep the slew rate at constant level, or other important parameters to be independent from the ambient temperature.

I claim:

1. A device for supplying a signal delayed by a predetermined period, the device comprising:
   an input terminal for receiving an input main signal;
   an output terminal at which a delayed output signal is generated;
   a vernier that provides variable delays for a main signal;
   a sensor incorporated into said vernier for sensing for the vernier's temperature;
   a feedback loop for maintaining the temperature of the vernier at a constant level.

2. The device according to claim 1, wherein the sensor is incorporated into the vernier's silicon die.

3. The device according to claim 1, wherein the feedback loop comprises an integrator for providing on his output integrated difference of the temperature sensor output and reference voltage.

4. The device according to claim 1, wherein the feedback loop comprises a cooler/heater for maintaining the temperature of vernier.

5. The device according to claim 4, wherein the cooler/heater is implemented in Peltier effect reversable heat pump.

6. The device according to claim 4, wherein the vernier has a package, and the cooler/heater has a low temperature resistance contact with the vernier's package.

7. A method for supplying a signal delayed by a predetermined period, the method comprising the steps of:
   receiving an input main signal:
   providing a vernier for generating variable delays for the input main signal, said vernier having a package;
   generating an output signal after a predetermined delay period;
   sensing for vernier's temperature to maintain it at a constant level, wherein the temperature is maintained by using a cooler/heater having a low temperature resistance contact with the vernier's package.

8. A method for supplying a signal delayed by a predetermined period, the method comprising the steps of:
   receiving an input main signal;
   providing a vernier for generating variable delays for the main signal;
   generating an output signal after a predetermined delay period;
   sensing for vernier's temperature to maintain it at a constant level, wherein the temperature is maintained as close to the ambient temperature as possible so as to reduce extra heating in temperature stabilizing.

* * * * *